United States Patent
Pasqualetto

(10) Patent No.: US 11,303,112 B2
(45) Date of Patent: Apr. 12, 2022

(54) METHOD FOR AT LEAST PARTIALLY REMOVING OSCILLATIONS OCCURRING AT THE END OF A CURRENT DISCHARGE FOR AN H-BRIDGE

(71) Applicants: CONTINENTAL AUTOMOTIVE FRANCE, Toulouse (FR); CONTINENTAL AUTOMOTIVE GMBH, Hannover (DE)

(72) Inventor: Angelo Pasqualetto, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 6 days.

(21) Appl. No.: 16/764,988

(22) PCT Filed: Dec. 11, 2018

(86) PCT No.: PCT/FR2018/053198
§ 371 (c)(1),
(2) Date: May 18, 2020

(87) PCT Pub. No.: WO2019/122597
PCT Pub. Date: Jun. 27, 2019

(65) Prior Publication Data
US 2020/0403400 A1    Dec. 24, 2020

(30) Foreign Application Priority Data

Dec. 19, 2017    (FR) ...................................... 1762479

(51) Int. Cl.
H02M 7/5387    (2007.01)
H02H 9/00    (2006.01)
(Continued)

(52) U.S. Cl.
CPC ....... H02H 9/002 (2013.01); G01R 19/16538 (2013.01); G01R 19/175 (2013.01);
(Continued)

(58) Field of Classification Search
CPC .......... H02P 7/04; H02M 7/5387; H02M 1/12
See application file for complete search history.

(56) References Cited

U.S. PATENT DOCUMENTS 5,119,000 A * 6/1992 Schultz ..................... H02P 7/04
                                                        318/293
5,952,856 A    9/1999 Horiguchi et al.
(Continued)

OTHER PUBLICATIONS

International Search Report, PCT/FR2018/053198, dated Mar. 6, 2019.
(Continued)

*Primary Examiner* — Harry R Behm
(74) *Attorney, Agent, or Firm* — Nixon & Vanderhye

(57) ABSTRACT

Disclosed is a method for at least partially removing the oscillations occurring at the end of a current discharge through the structural diodes for a switching structure supplying power to an inductive load in the form of an H-bridge and including two controlled high or low power switches forming part of a high circuit or a low circuit, respectively, between a respective output and a power source or a ground, the switching structure having one of its outputs below the ground potential and the other above the potential of the power source during the current discharge through the structural diodes. A detection or anticipation of the end of discharge and a forced preservation of a freewheel after the detection of the end of discharge are carried out, the forced preservation of the freewheel after the detection of the end of discharge taking place for a predetermined preservation time.

20 Claims, 11 Drawing Sheets

(51) Int. Cl.
*H02P 7/03* (2016.01)
*G01R 19/165* (2006.01)
*G01R 19/175* (2006.01)
*H02M 1/12* (2006.01)

(52) U.S. Cl.
CPC ................ *H02P 7/04* (2016.02); *H02M 1/12* (2013.01); *H02M 7/5387* (2013.01)

(56) References Cited

U.S. PATENT DOCUMENTS

| | | | | |
|---|---|---|---|---|
| 6,002,256 A | * | 12/1999 | Slade | G01R 33/3614 |
| | | | | 324/318 |
| 2010/0254221 A1 | * | 10/2010 | Smith | B06B 1/0269 |
| | | | | 367/137 |
| 2014/0103845 A1 | * | 4/2014 | Bredemann | H02P 6/15 |
| | | | | 318/400.27 |
| 2014/0218099 A1 | | 8/2014 | Yamada et al. | |
| 2014/0333320 A1 | | 11/2014 | Barnetova | |
| 2015/0145553 A1 | | 5/2015 | Pasqualetto | |
| 2015/0180340 A1 | | 6/2015 | Ernest et al. | |

OTHER PUBLICATIONS

Office Action issued in Chinese Patent Application No. 201880081923.0 dated Nov. 29, 2021.

* cited by examiner

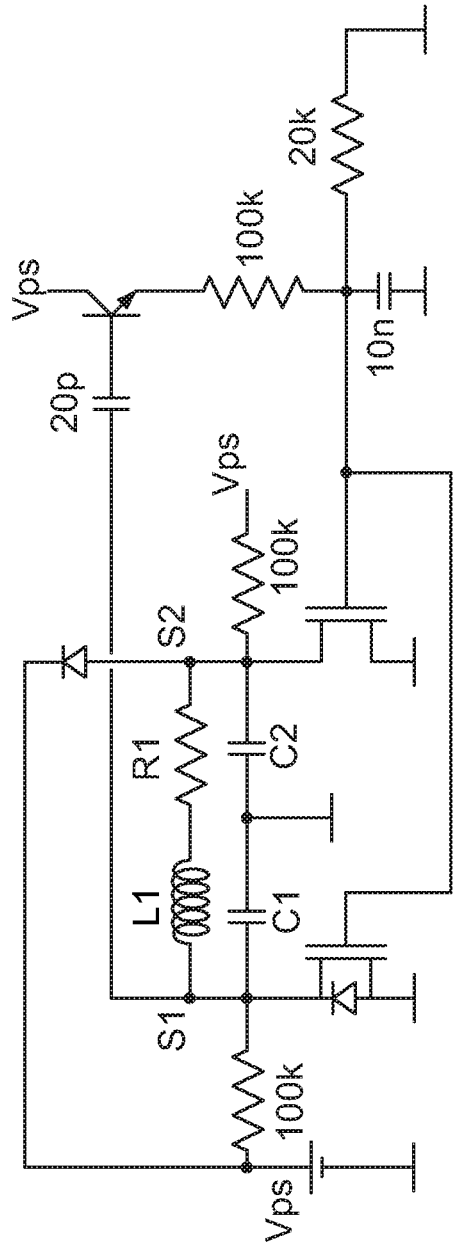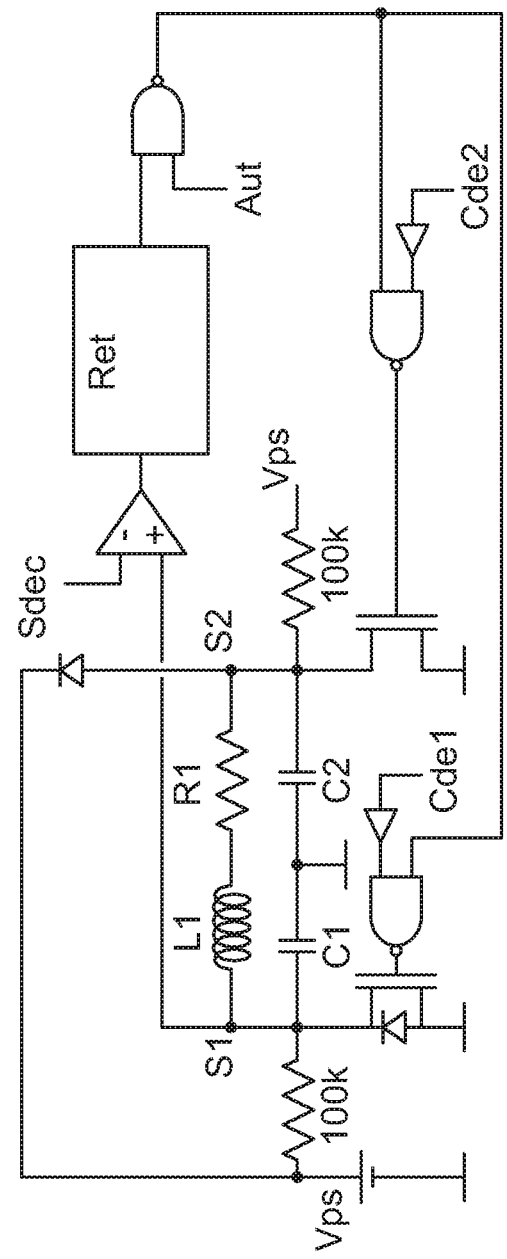

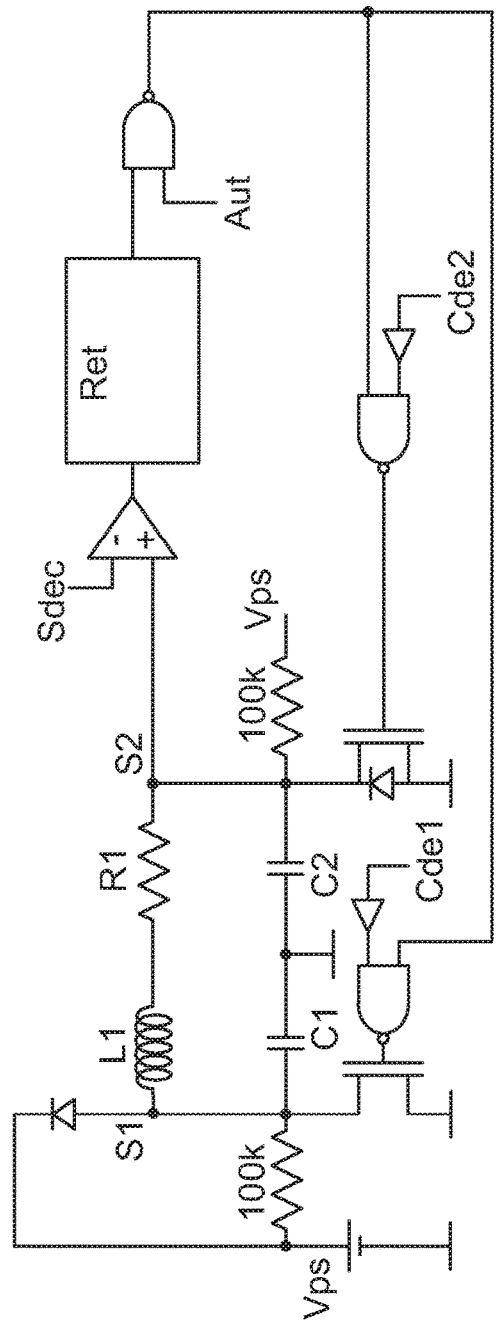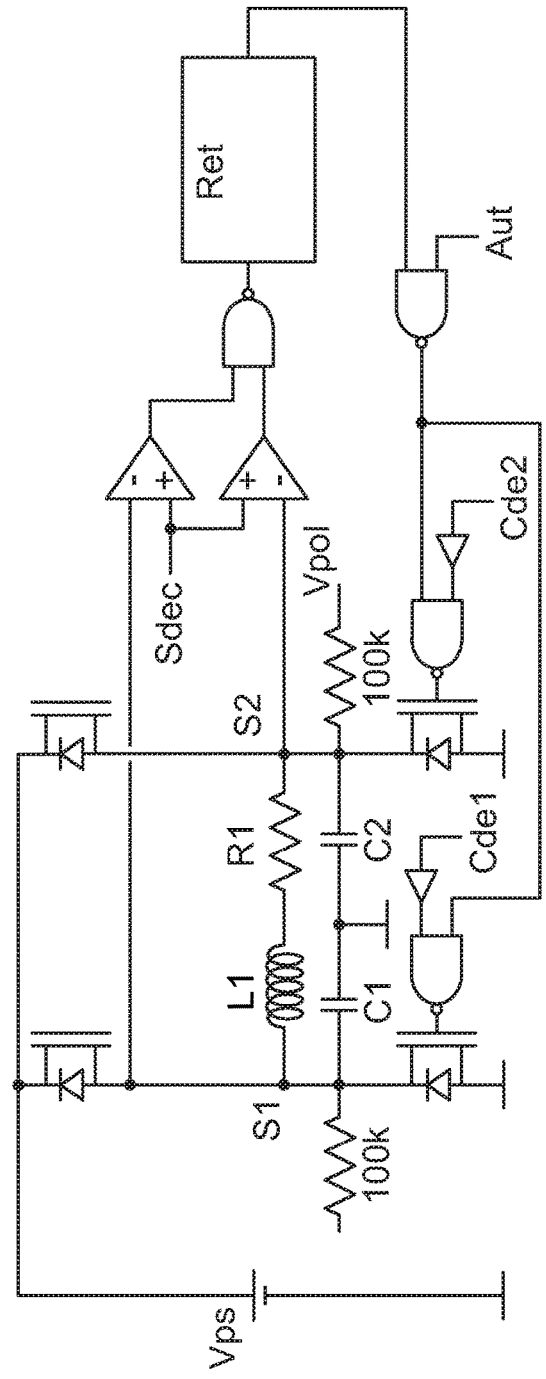

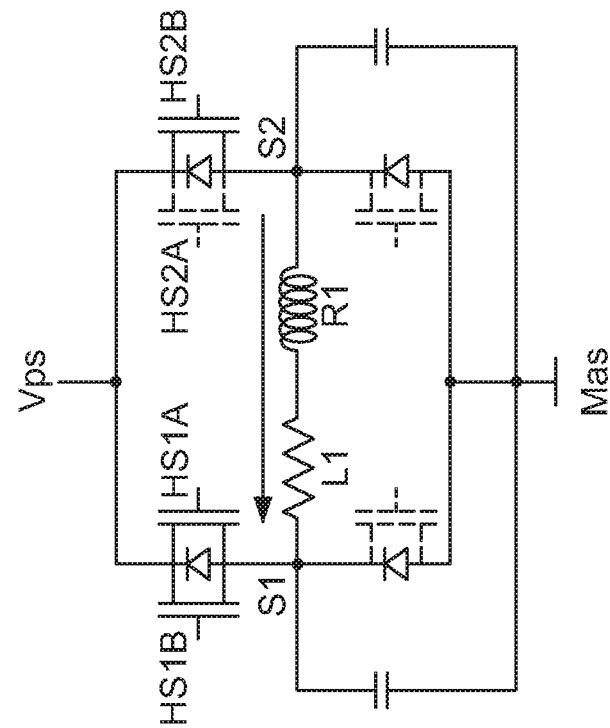
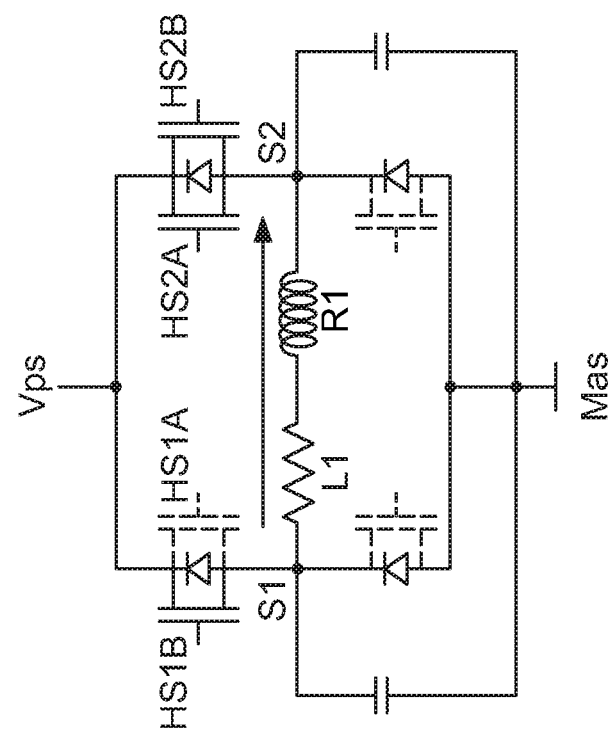

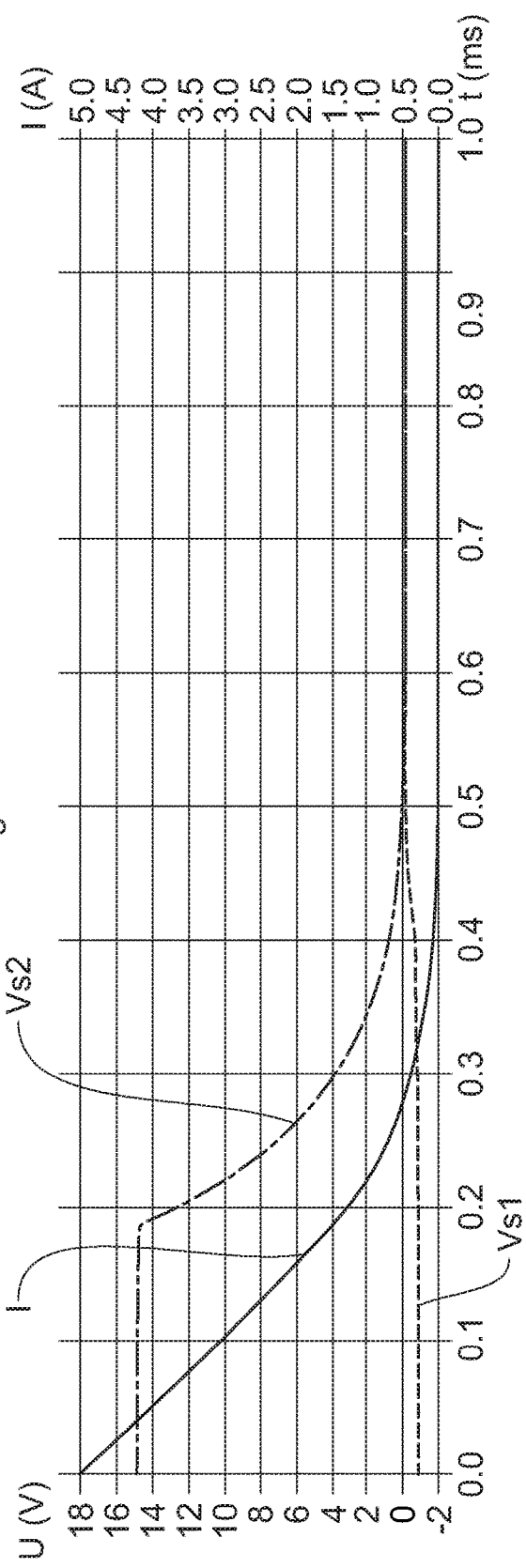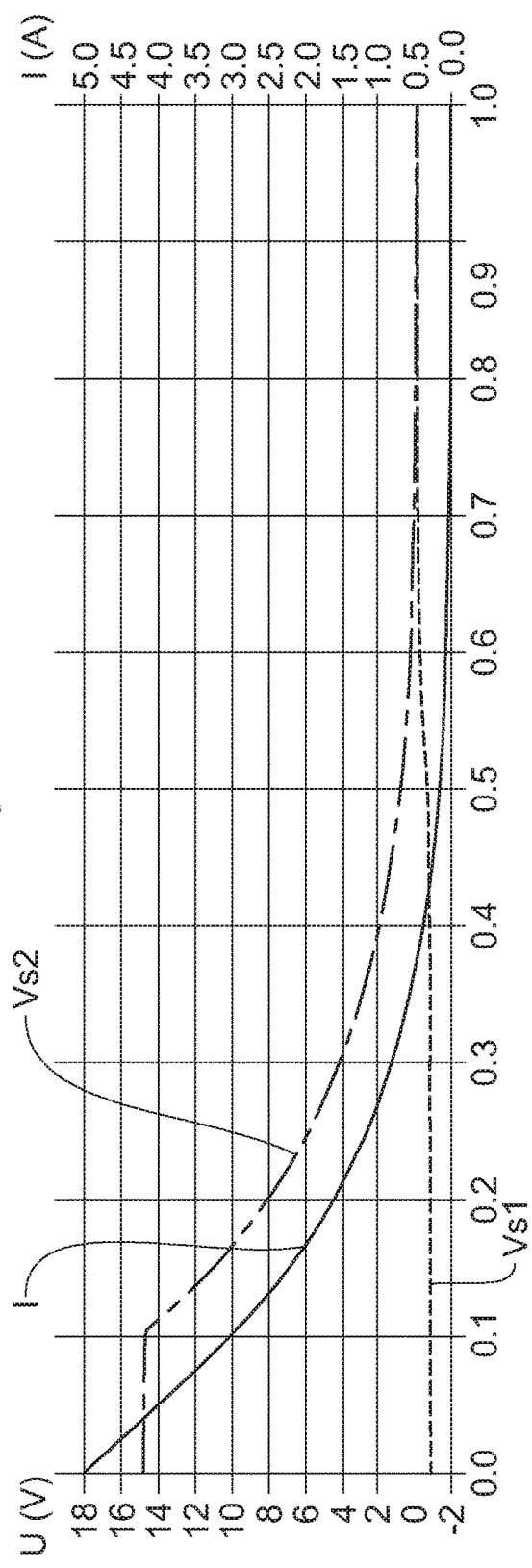

METHOD FOR AT LEAST PARTIALLY REMOVING OSCILLATIONS OCCURRING AT THE END OF A CURRENT DISCHARGE FOR AN H-BRIDGE

BACKGROUND OF THE INVENTION

The present invention relates to a method for at least partially removing the oscillations occurring at the end of a current discharge through the structural diodes for a switching structure supplying power to an inductive load 1 in the form of an H-bridge.

The teaching of the invention can also be intended for an application for a simplified H-bridge structure, such as a half-H-bridge.

The power supply for an inductive load, such as for example an electric motor, generally uses a switching structure, such as an H-bridge of switches, this not being limiting for the present invention.

In what follows, the structure of an H-bridge will be detailed. The structure of a half-H-bridge can be extrapolated from an H-bridge structure by including only one power switch for one high circuit or one low circuit.

As shown in FIG. 1, an H-bridge as switching structure for switching an inductive load 1 comprises four power switches HS1, HS2, LS1 and LS2, namely two "high" switches HS1, HS2 on the side of a positive power supply Vps, for example a battery producing a positive supply voltage, and two "low" switches LS1 and LS2 on the side of a negative power supply or the ground Mas. Each switch generally comprises a power MOS transistor. The inductive load 1 is connected to the H-bridge by the outputs s1 and s2.

The amount of current injected into the inductive load, delivered by the switching circuit, is generally controlled by a sequence of analog control signals for controlling the four switches, produced from a setpoint control signal. The setpoint control signal and the analog control signals are generally pulse-width-modulated signals, also known under the acronym PWM. By virtue of such a switching structure, the inductive load is able to be controlled in both directions.

The switching structure has one output s1, s2, i.e. at a potential slightly lower than that of the ground Mas, and the other output at a potential slightly higher than that of the power source Vps during the current discharge through the structural diodes, with no high HS1, HS2 or low LS1, LS2 power switch then being on, a discharge current leaving the output s1 for the output s2 or vice versa.

Voltage oscillations occur on the outputs s1 and s2 at the end of the current discharge through the structural diodes. In an H-bridge, the open-circuiting gives rise to the rapid current decrease. Indeed, for a freewheel, which puts the two outputs of the H-bridge at the same potential, i.e. the ground Mas for a low freewheel, and the positive supply voltage Vps for a high freewheel, a decreasing exponential is obtained whose tangent is 0.

FIG. 2 shows an example of inductive discharge by recirculation in the structural diodes for an inductance of 1 mH, a series resistance of 1 Ω and a voltage of 14 V, from a current intensity of 5 A. The current is at zero after approximately 300 μs.

Now, in the recirculation of the current to the voltage of the power source, the virtual tangent would be negative if the structural diodes were shorted. However, since the structural diodes do not allow current reversal, the current does not go past the value 0 and remains at this value. The device seems advantageous when a rapid discharge time is desired. However, there is a drawback, which is a voltage oscillation of the outputs.

This oscillation, starting at the end of current discharge, is due to the inductance of the load and to the output capacitors C1 and C2, placed near the connector, which are necessary for protection against electrostatic discharges. Typically, a capacitor value of 10 nF is used. In a simple model, the load is represented by a resistor R in series with an inductor L. FIG. 3 illustrates the circuit at the end of current discharge, when the diodes are no longer on.

Looking at the diodes in a simplified model in which they introduce a fixed voltage offset Vf, when they are on, the differential equation governing the evolution of the current i during the discharge is as follows:

$$L \cdot (di/dt) + R \cdot i + Vps - 2Vf = 0$$

where L is the value of the inductance, R is the value of the resistance and i is the value of the current flowing through the load, which varies as a function of time.

By assigning $i_0$ to the initial value of the current, when the transistors are open-circuited, the current i as a function of time t, while the diodes are on, is:

$$i(t) = (i_0 + (Vps - 2Vf)/R) \cdot \exp(-t \cdot R/L) - (Vps - 2Vf)/R$$

The time required for the current to arrive at the value zero is:

$$t1 = (L/R) \cdot (\mathrm{Ln}(R \cdot i_0 + Vps - 2Vf) - \mathrm{Ln}(Vps - 2Vf))$$

For example, if R=1Ω, L=1 mH, Vf=0.7 V, $i_0$=5 A, and Vps=14 V, the time required t1 is 334 ns. This does not exactly correlate the simulation because the voltage Vf also depends on the current flowing through the diodes.

At the moment at which the current is canceled, the voltage at the terminals of the load is still Vps−2Vf, but beyond that, we are dealing with the oscillating circuit illustrated in FIG. 3, with an inductor L, a resistor R and two capacitors C1 and C2.

Since the diodes are no longer on, the voltage across the terminals of the load is V(t). By taking C1=C and C2=C in Ceq=C1·C2/(C1+C2), we obtain Ceq=C/2.

The differential equations are:

$$dV/dt = 2 \cdot i/C$$

$$L \cdot (d^2 i/dt^2) + R \cdot (di/dt) + 2i/C = 0$$

For a damped sinusoid solution, $R^2$ must be less than 8 L/C. By taking L=1 mH and C=10 nF, the condition is fulfilled if R is less than 894Ω, which is always the case in practice because the actuators controlled have a resistance of less than 10Ω.

Similarly, an inductance L=100 mH would result in R<8940 Ω and an inductance of 100 pH would result in R<282 Ω in order to still be in the case of a damped sinusoid.

A simulation, the result of which is in FIG. 4, for R=1Ω, L=1 mH, Vf=0.7 V, $i_0$=5 A and Vps=14 V gives a significant variation of the output voltages, up to a relatively fixed potential.

As we are far from the limit condition R=894Ω, the damping is less and the duration of the oscillation is long. The frequency is given by the formula f=1/(2π.root(L.Ceq)).

In this case, the frequency f is equal to approximately 71 kHz, which is verified quite well by the simulation result shown in FIG. 4. The abscissa in this FIG. 4 shows a time ranging from 0 to 1 millisecond and voltage curves s1 and s2 at the first and second outputs of the H-bridge, respectively. Finally, a current curve I is shown.

A bias resistance of 10 kΩ on each output is insufficient to eliminate the oscillation. With bias resistances of 500Ω, the result is just about satisfactory, but this solution cannot be generalized due to such a low bias resistance, which would interfere with the diagnosis in the deactivated state and would generate a small additional current during a low freewheel.

What is usually used is a fixed bias resistor of 100 kΩ on each output. Symmetrical oscillations would be obtained by biasing to the ground, for example with 10 kΩ between each output and the ground.

FIG. 5 shows an example of a detector circuit on one of the outputs of the H-bridge making it possible to restart a freewheel for a limited time. A positive edge detector 3 and a timed freewheel control 4 are used. Here, the first positive edge on the voltage at s2 allows active freewheeling, that is to say turning-on of the power switches in the form of transistors between the output s1 and the ground Mas, on the one hand, and between the output s2 and the ground Mas, on the other hand. The oscillation ends quickly and, at the end of the timing, the voltages on the outputs s1 and s2 slowly rise toward the bias voltage Vps under the effect of the bias resistors.

By using a detector circuit on one of the outputs of the H-bridge, it is possible to restart a freewheel for a limited time. The circuit shown in FIG. 6 performs these functions analogously.

Initially, the current in the coil L1 of the load is directed from the output s1 to the output s2. The inductor L1 sucks up the positive charges at the output s1 and brings them to the output s2, creating a negative potential at the output s1 higher than Vps at the output s2. This remains true as long as the current is not canceled.

When the current has reached the zero value, the circuit L1, R1, Ceq=C1//C2 becomes isolated from the ground, except between the capacitors C1 and C2, because the diodes are no longer on, but as the voltages across the terminals of the capacitors C1 and C2 are not zero, the oscillating circuit starts at the frequency $f=1/(2\pi.\text{root}(L.Ceq))$.

Thus the potential at the output s1 increases rapidly. The voltage variation at the output s1 is transmitted by a low-value capacitor in the form of base current, which is amplified by an NPN transistor. The collector current allows the charge of a capacitor (10 nF) and therefore its voltage across the terminals to be increased. This voltage is used to activate the freewheel, by being connected to the controls of the freewheel transistors.

The power switches are again open-circuited when the 20 kΩ resistor has discharged the 10 nF capacitor. In this case, it is a time constant of 200 μs that can be increased or reduced by modifying the value of this 20 kΩ resistor.

This circuit allows, for example, confirmation of the operation of the principle by simulation, which has been done here, but is not of great practical interest because the capacitors are expensive to integrate into a component for only a few tens of picofarrads. A fortiori, the 10 nF capacitor should be external and require an additional pin.

In addition, it is also necessary to mix this condition with normal operation when we want to force the freewheel at the end of discharge, which involves sending the control signal to the logic and not directly to the gates of the MOS transistors.

SUMMARY OF THE INVENTION

The problem on which the present invention is based is, for a switching structure supplying power to an inductive load in the form of an H-bridge, to at least partially remove oscillations occurring during a freewheel.

In a first embodiment, the invention relates to a method for at least partially removing the oscillations occurring during a current discharge through structural diodes for a switching structure supplying power to an inductive load in the form of an H-bridge forming a high and low circuit, the switching structure comprising two controlled high or low power switches forming part of a high circuit or a low circuit, respectively, between a respective output and a power source or a ground, the switching structure being adapted to control a current in the load by being connected to the electric power source or to the ground in order to control the inductive load, at least two capacitors being connected to bypass the inductive load between the outputs, the switching structure having one of its outputs below the ground potential and the other output above the potential of the power source during the current discharge through the structural diodes, with no high or low power switch then being on, a discharge current leaving one output for the other, voltage oscillations occurring at the end of current discharge through the structural diodes, characterized in that a detection or anticipation of the end of discharge and a forced preservation of a freewheel after the detection of the end of discharge are carried out, the forced preservation of the freewheel after the detection of the end of discharge taking place for a predetermined preservation time.

In a second embodiment, the invention also relates to a method for at least partially removing the oscillations occurring at the end of a current discharge through structural diodes for a switching structure supplying power to an inductive load in the form of an H-bridge forming a high and low circuit, the switching structure comprising two controlled high or low power switches forming part of a high circuit or a low circuit, respectively, between a respective output and a power source or a ground, the switching structure being adapted to control a current in the load by being connected to the electric power source or to the ground in order to control the inductive load, at least two capacitors being connected to bypass the inductive load between the outputs, the switching structure having one of its outputs below the ground potential and the other output above the potential of the power source during the current discharge through the structural diodes, with no high or low power switch then being on, a discharge current leaving one output for the other, voltage oscillations occurring on the two outputs at the end of current discharge through the structural diodes, characterized in that a resistive freewheel is triggered before or instead of the end of the current discharge through the structural diodes in the high or low circuit comprising a nonzero resistance of between 5 and 200 ohms, one of the two high or low power switches being kept only partially on, and the other switch being fully on.

Advantageously, the detection of the end of current discharge through the structural diodes takes place either on the basis of a discharge voltage of the output from which the discharge current leaves or on the basis of the discharge voltage slope or else on the basis of both the discharge voltage and the discharge voltage slope, the predetermined preservation time for the freewheel starting as soon as the discharge voltage goes back above a predetermined calibratable voltage threshold and/or as soon as the voltage slope is higher than a predetermined calibratable slope threshold, the voltage and voltage slope thresholds being predetermined so as to be representative of a or of first oscillations occurring and the predetermined calibratable preservation time for the freewheel being a time calculated or estimated by experience so that the oscillations are at least attenuated by being below a voltage oscillation threshold of less than 5% of the maximum voltage dynamic range.

Advantageously, the detection of the end of current discharge through the structural diodes takes place on the basis of a detection of a discharge current close to zero and/or a detection of the current slope, the predetermined preservation time for the freewheel starting from said detection of current and/or of current slope and the predetermined preservation time for the freewheel being a time calculated or estimated by experience so that the oscillations are at least attenuated by being below an oscillation threshold of less than 5%.

Advantageously, the detection of the end of current discharge through the structural diodes takes place on the basis of a detection of a discharge current that has not yet reached zero, and consideration is given to a double current threshold and a time interval to move from one threshold to the other, with calculation, on the basis of the two thresholds and the time interval, of a future instant with a margin of uncertainty, at which future instant the current becomes zero, and of a time for which the freewheel lasts. Advantageously, the detection of the end of current discharge through the structural diodes potentially takes place on the basis of a discharge voltage of the active output and/or on the basis of the discharge voltage slope after a detection of a discharge current close to zero, the current threshold being increased each time the predetermined voltage threshold and/or the predetermined slope threshold are detected and the current threshold being decreased each time the predetermined voltage threshold and/or the predetermined slope threshold are not detected.

Advantageously, the detection of the end of current discharge through the structural diodes potentially takes place on the basis of a discharge voltage of the active output and/or on the basis of the discharge voltage slope after the end of a time constant estimating the discharge time after a current threshold is crossed, the time constant being increased each time the predetermined voltage threshold and/or the predetermined slope threshold are detected and the time constant being decreased each time the predetermined voltage threshold and/or the predetermined slope threshold are not detected.

Advantageously, the time constant estimates the discharge time after a current threshold is crossed.

Optionally, for the second embodiment of the invention, one of the two power switches of the same low or high pair is split so as to be partially on, a percentage of the split power switch being operational during the freewheel while the rest of the split power switch is inactive, this operational percentage being between 0.1% and 4% of the total split power switch.

Advantageously, the freewheel time is programmed and determined either by calculation or by experience, if applicable after detection of a nonzero current threshold.

Advantageously, the second embodiment follows a phase of current discharge by the structural diodes that ends in a nonzero current. This end of discharge by the diodes can be triggered either by the crossing of a current threshold or at the end of a time constant. Heating occurs at the resistive switches, but it is more limited the lower the current, at the start of the resistive freewheel, hence the advantage of first lowering it by means of flow in the structural diodes. The discharge by resistive freewheel is faster the higher the resistance, and can be faster than the discharge through the diodes.

According to the first embodiment, the present invention relates to an assembly comprising an inductive load and its power supply device, the supply device comprising a switching structure of an H-bridge forming high and low circuits, respectively, the switching structure comprising a pair of high or low power switches controlled by a control unit between an output and an electric power source or a ground, respectively, for controlling the inductive load, at least two capacitors being connected to bypass the inductive load between the outputs, the control unit controlling a freewheel by selective action on the pair of high or low power switches, characterized in that the assembly implements such a method for at least partially removing the oscillations occurring at the end of a current discharge through the structural diodes, the control unit comprises means for at least one detection of an end of current discharge through the structural diodes, means for storing a trigger threshold specific to the detection or to each detection, and means for forced preservation of the freewheel when the trigger threshold is crossed for a stored predetermined preservation time.

According to the second embodiment, the present invention relates to an assembly comprising an inductive load and its power supply device, the supply device comprising a switching structure of an H-bridge forming high and low circuits, respectively, the switching structure comprising a pair of high or low power switches controlled by a control unit between an output and an electric power source or a ground, respectively, for controlling the inductive load, at least two capacitors being connected to bypass the inductive load between the outputs, the control unit controlling a freewheel by selective action on the pair of high or low power switches, characterized in that the assembly implements a method for at least partially removing the oscillations occurring at the end of a current discharge through the structural diodes, the control unit comprising splitting means on a pair of high or low power switches in order to keep only one of the two power switches of the high or low pair partially on and the other fully on during the resistive freewheel, triggered before or instead of the end of the current discharge through the structural diodes, while the rest of the partially-on power switch of the high or low pair is inactive.

BRIEF DESCRIPTION OF THE DRAWINGS

Other features, aims and advantages of the present invention will become apparent on reading the detailed description that follows and on examining the appended drawings given by way of non-limiting examples, and in which:

FIG. 6 shows a detector circuit positioned on one of the outputs of the H-bridge analogously starting a freewheel for a limited time according to the prior art, FIG. 7 shows a detector circuit positioned on the first output of the H-bridge implementing a first embodiment of the method according to the present invention by means of detection of the end of current discharge through the structural diodes and forced preservation of a low freewheel after the detection of the end of discharge according to a comparison of the output voltage with a trigger threshold, the current flowing from the second output of the H-bridge to the first output, FIG. 8 shows a detector circuit positioned on the second output s2 of the H-bridge implementing a first embodiment of the method according to the present invention by means of detection of the end of current discharge through the structural diodes and forced preservation of a low freewheel after the detection of the end of discharge according to a comparison of the voltage with a trigger threshold, the current flowing from the first output of the H-bridge to the second output, FIG. 9 shows two detector circuits positioned on the first or the second output of the H-bridge, respectively, implementing a first embodiment of the method according to the present invention by means of detection of the end of discharge and forced preservation of a low freewheel after the detection of the end of discharge according to a comparison of the voltage with a trigger threshold, the current flowing from the first output to the second output of the H-bridge, or vice versa, FIGS. 12*a* and 12*b* show, for a high resistive freewheel, the elements used on the basis of the direction of the current, the elements that are not on being in dotted lines, FIGS. 13 to 17 illustrate curves of voltage for first and second outputs and of discharge current as a function of time in a method according to a second embodiment of the present invention, the freewheel being performed in the high or low circuit comprising a nonzero resistance of between 5 and 1 kohm or kiloohm, the two high or low power switches being kept only partially on.

DESCRIPTION OF THE PREFERRED EMBODIMENTS

Referring more particularly to FIGS. 1 and 7 to 17, the present invention relates to a method for at least partially removing the oscillations occurring at the end of a current discharge through structural diodes for a switching structure supplying power to an inductive load 1, L1, R1 in the form of an H-bridge.

There are two main embodiments of the present invention. The first embodiment, illustrated in FIGS. 7 to 10, is based on a rapid discharge through the structural diodes and on a detection or anticipation of the end of discharge and a forced preservation of the freewheel after the detection of the end of discharge. In the second embodiment of the present invention, illustrated in FIGS. 11 to 17, the freewheel is performed in a circuit having a nonzero resistance of between 5 and 200 ohms, with one of the two power switches of the high or low circuit kept only partially on. The second embodiment can completely replace the discharge through the structural diodes, or intervene after a first phase of decrease of the current by means of the discharge through the structural diodes.

Figure 1:
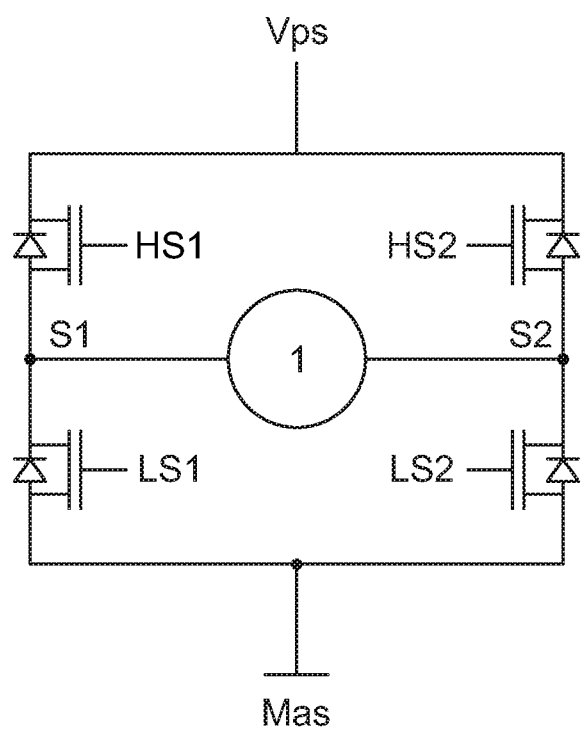
FIG. 1 is a schematic representation of a view of a switching structure in the form of an H-bridge, the oscillations at the end of a current discharge through the structural diodes for this structure being able to be removed by a method according to the present invention.

For the two embodiments of the present invention, the method for at least partially removing the oscillations occurs at the end of a current discharge through structural diodes for a switching structure supplying power to an inductive load referenced 1 in FIG. 1 and illustrated by its inductance L1 and its resistance R1 in FIGS. 7 to 12.

The switching structure is in the form of an H-bridge forming a high and low circuit. The switching structure comprises two controlled high HS1, HS2 or low LS1, LS2 power switches, forming part of a high circuit or a low circuit, respectively, between a respective output s1, s2 and a power source Vps, also called battery, or a ground mas.

The switching structure is adapted to control a current in the load by being connected to the electric power source Vps or to the ground Mas in order to control the inductive load 1, L1, R1. At least two capacitors C1, C2 are connected to bypass the inductive load 1, L1, R1 between the outputs s1, s2. In the absence of these capacitors, there would be no oscillations. In fact, these capacitors are introduced to protect against electrostatic discharges. Sometimes the supplier of the load is tempted to integrate them into the load itself.

The switching structure has one of its outputs s1, s2 below the potential of the ground mas and the other above the potential of the power source Vps during the discharge of the current through the structural diodes, no high HS1, HS2 or low LS1, LS2 power switch then being on.

Indeed, during a rapid discharge through the diodes, no switch is on except at the level of the structural diodes, and one of the outputs takes a potential lower than the ground, while the the other takes a potential higher than the power source Vps. A discharge current leaves one output s1, s2 for the other s2, s1, with voltage oscillations occurring on the outputs s1, s2 at the end of discharge of the current through the structural diodes.

Figure 4:
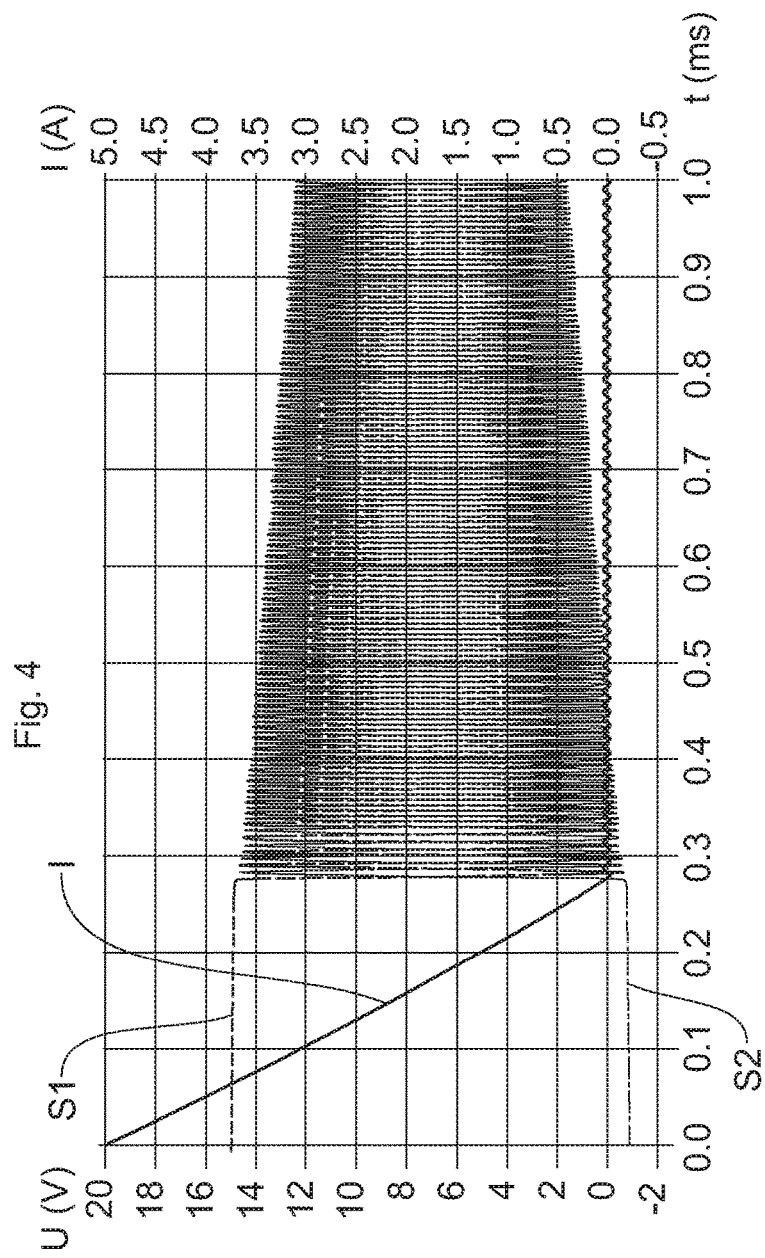
FIG. 4 shows voltage and current curves having oscillations at the end of a recirculation of the current through the diodes without implementation of the method according to the present invention, these oscillations being obtained by simulation with the values of 1 mH for the inductance, 1 ohm for the resistance, 14 V for battery voltage, 0.7 V for the diode voltage and 5 A for the initial current through the inductance.
Figure 5:
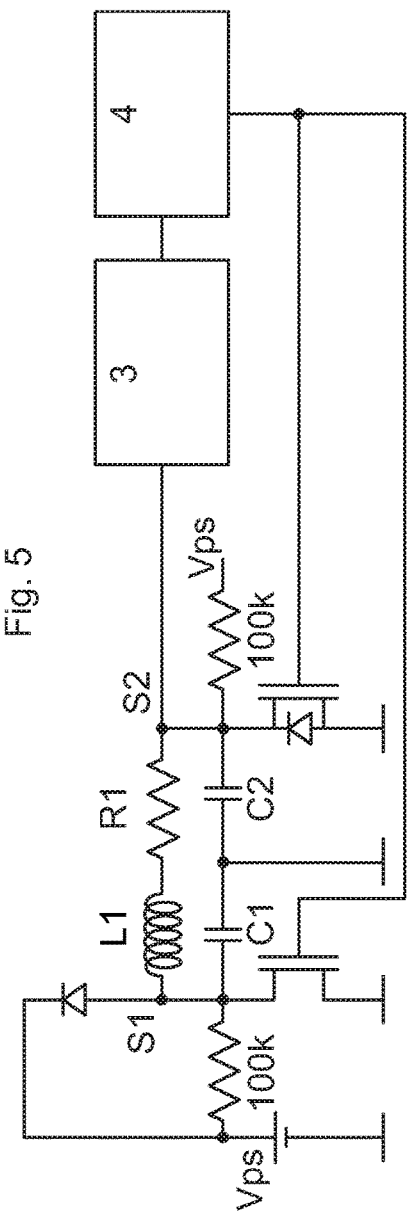
FIG. 5 shows a detector circuit positioned on one of the outputs of the H-bridge for starting a freewheel for a limited time according to the prior art.

At the end of a discharge through the diodes, when the current no longer flows through them, and without implementation of one of the methods of the present invention, the potential of each of the outputs s1 and s2 is between that of the power source Vps and that of the ground Mas and varies in a fluctuating manner, as illustrated in FIG. 4.

Still referring to FIGS. 1 and 7 to 10, in this first embodiment of the present invention, a detection or anticipation of the end of current discharge through the structural diodes and a forced preservation of a freewheel after the detection of the end of discharge are carried out. The forced preservation of the freewheel after the detection of the end of discharge takes place for a predetermined preservation time.

A processing of the detection and a timing of the forcing of the freewheel are therefore performed. It is possible to perform a detection at least based on the voltage or the current with or without consideration of a time constant combining these various detections.

In FIG. 7, a trigger threshold Sdec is compared with the value of the voltage on the output s1. If said value is higher than the threshold Sdec, a comparator delivers a high logic level that ends up, provided that the authorization Aut is at the high level, that is to say authorized, controlling the two power switches or transistors by means of a high level and turning them on independently of the controls Cde1 and Cde2.

If the voltage value at s1 is lower than the trigger threshold Sdec, the comparator delivers a low level signifying a nontriggering, which, once transmitted, leaves the conventional controls Cde1 and Cde2 to act on the two power switches.

If the voltage value becomes lower than the trigger threshold Sdec precisely because the two power switches are turned on, this activation is maintained by a delay Ret introduced after the comparator. The value of the delay Ret is programmable. For example, a simulation for R1=1 ohm, L1=1 mH for millihenry, Vps=14 V for volts, shows that 500 μs or microseconds are enough to put an end to the oscillations. When this time has elapsed, the two power switches return to the off state and the voltages at s1 and s2 progressively return to the bias voltage.

The Authorization Aut signal locks this device when it is in the low state, and leaves the controls Cde1 and Cde2 to act on the two power switches. This allows this device to be activated only in the appropriate phase, and also to be conditioned to a mode programmed by digital bus. For example, in the event of a disconnection after a short between one of the outputs s1 or s2 and the power source Vps, it would be inappropriate to turn on the two low freewheel power switches again, which would restore the short. It can also be used dynamically, for example at times when an activation from the control Cd1 or the control Cd2 is meant to be allowed to pass.

The current in the inductance is not always oriented from s1 to s2 and, when it is oriented from s2 to s1, the role of the two outputs s1 and s2 is reversed. It is then necessary to take the voltage to compare from the output s2 instead of the output s1 as shown in FIG. 8. It is, however, possible to be satisfied with a single detector as in FIG. 7 or in FIG. 8, at the cost of a slower detection for one of the two directions of the current.

As the current in the inductance L1 can be oriented in both directions, the complete circuit must advantageously combine the two previous figures, which is shown in FIG. 9. In this FIG. 9, the bias voltage Vpol can be the battery voltage Vps, the ground or any other voltage.

The delay Ret in the low level can be achieved, for example, by a delay in the signal, through a succession of flip-flops, for example, clocked by the same clock. Then, the "OR" between the signal and the signals at the output of each flip-flop provides a signal where the duration of the high state reaches the delay value Ret.

Figure 10:
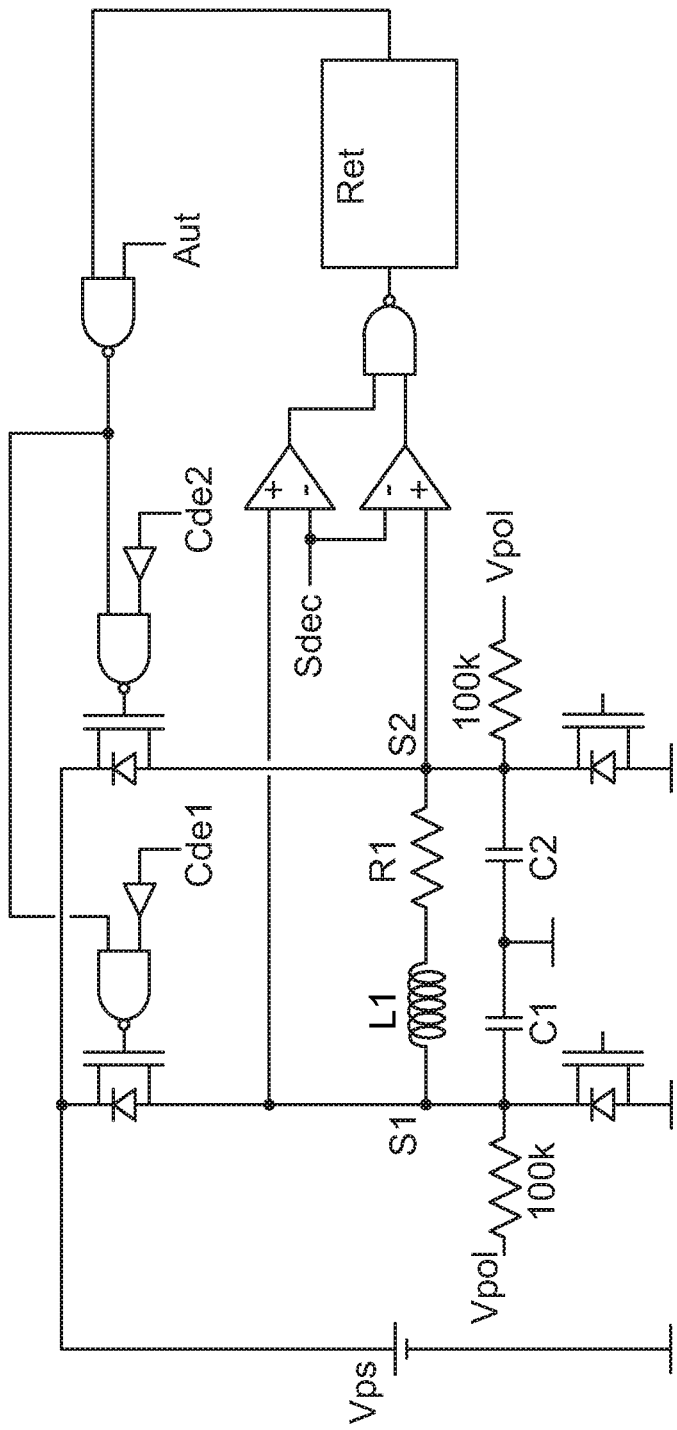
FIG. 10 shows two detector circuits positioned on the first or the second output of the H-bridge, respectively, implementing a first embodiment of the method according to the present invention by means of detection of the end of discharge and forced preservation of a high freewheel after the detection of the end of discharge according to a comparison of the voltage with a trigger threshold, the current flowing from the first output to the second output of the H-bridge, or vice versa.

The case of a high freewheel is similar to the case of a freewheel in FIGS. 7 to 9 and is illustrated in FIG. 10.

The directions of the comparators therein are reversed, the trigger threshold Sdec being taken close to the battery voltage Vps. The terminal part of the logic must be referenced to the source of the controlled transistor, which is not necessarily the ground. This is a usual difficulty in controlling the two power switches on the high side, the drain of which is connected to the voltage Vps, and where the source is floating between the power source Vps and the ground. Blocking the oscillations from the start thereof does not remove the initial transients, since they are necessary for the blocking.

In FIGS. 9 and 10, the comparators have been reversed in order to use the two signals in a "NAND" operator. Thus, if either of the two outputs s1 or s2 has a potential higher than the threshold voltage, a high signal is presented to the delay circuit for the low level. Other operators could have been used to perform the function. Here, the choice was made to use only "NANDs" and inverters.

In the description above for the first embodiment of the invention, the detection of the end of discharge takes place on the basis of a discharge voltage of the output s1 or of the output s2, detection that corresponds to the reaching of a zero discharge current, which represents a first optional mode of the first embodiment.

The detection of the end of discharge can take place on the basis of the discharge voltage slope or on the basis of both the discharge voltage and the discharge voltage slope. In these cases, the predetermined preservation time for the freewheel begins as soon as the discharge voltage goes back above a predetermined calibratable voltage threshold and/or as soon as the voltage slope is higher than a predetermined calibratable slope threshold.

The voltage and voltage slope thresholds can be predetermined so as to be representative of one or of first oscillations occurring, and the predetermined calibratable preservation time for the freewheel can be a time calculated or estimated by experience so that the oscillations are at least attenuated by being below an oscillation threshold of less than 5% of the maximum voltage dynamic range.

According to a second optional mode that is within the scope of the first embodiment of the invention, the detection can take place on the basis of a current close to zero in the diodes. Several means can be used to implement this second optional mode, among other means: a measurement of the voltage across the terminals of said diodes, a circuit sensitive to substrate currents, the use of resistors, in particular the connection resistors between the integrated circuit and the connection pin. The latter technique requires an additional connecting wire to bring back the potential of the pin inside the integrated circuit, however.

Thus, between an internal voltage and an external voltage, a link resistor is inserted. Thus, assuming an outgoing current of 200 mA and a link resistance of 10 mΩ, a voltage of 2 mV is obtained, which would be the limit of sensitivity of detection of the current. It should be noted that the use of a voltage of 2 mV is quite difficult, since the comparator biases conventionally are of the order of 10 mV.

This involves starting the freewheel before the current has actually reached the zero value while being close to this zero value, and therefore the need to preserve the freewheel a little longer. If the aim of the resistance technique is to approach the zero value, then a specific resistance must be used, for example 100 mΩ. This would allow, for example, a 20 mA current limit. However, it is fairly inappropriate to use such a resistance value in a fixed manner. A switched resistor could be used but the switching transistor would be fairly expensive because it would need to be designed to carry a fairly high current.

A current detector based on the parasitic structures triggered by the substrate currents would be a tricky technique to perform but very advantageous in this case. Indeed, the flow of current in the structural diodes involves substrate currents. The effect of substrate currents is generally opposed since it is likely to produce undesirable effects in neighboring circuits. In this case, it is therefore a question of continuing to minimize substrate currents, but also of locally installing a structure known to be sensitive to them that then serves as a current detector flowing in the structural diodes concerned. The classic method in an integrated circuit is to use a current mirror. However, this usually results in an accuracy of 20% in power transistors. A better accuracy is possible, however, by using more silicon surface for the current mirror.

The detection of the end of discharge can thus take place on the basis of a detection of a discharge current close to zero and/or a current slope detection. In these two cases, the predetermined preservation time for the freewheel can start from said current and/or current slope detection and the predetermined preservation time for the freewheel can be a time calculated or estimated by experience so that the oscillations are at least attenuated by being below an oscillation threshold of less than 5% of the maximum voltage dynamic range.

As an alternative, the detection of the end of discharge can take place on the basis of a detection of a discharge current that has not yet reached zero by considering a double current threshold and a time interval to move from one threshold to the other, with calculation, on the basis of the two thresholds and a time interval, of a future instant with a margin of uncertainty, at which future instant the current becomes zero, and of a time for which the freewheel lasts. The margin of uncertainty depends on the technique used for the end of the current discharge. The better the accuracy, the smaller the margin of uncertainty. If we assume a maximum error of 250 mA for the current reading, then the threshold needs to be taken above 250 mA, for example 300 mA, which entails the end of rapid discharge through the diodes taking place between 50 mA and 550 mA. If a freewheel is started at 550 mA, there is more energy to remove than if it is started at 50 mA, and this requires a longer preservation time for the freewheel.

Even in the ideal case in which the discharge through the diodes is stopped when the current is zero, a case that corresponds to a voltage transient detection, the energy to be removed is nonzero owing to the voltage imbalance at the terminals of the oscillating circuit. It is possible to mathematically calculate the time required for the freewheel. Indeed, by assigning r to the freewheel resistance and ignoring the role of the output capacitors, the differential equation to be solved is:

$$L1 \cdot (di/dt) + (R1+r) \cdot i = 0$$

The solution depends on an arbitrary current discharge threshold, otherwise the discharge takes an infinite time for the current to reach 0.

$$t = Tau1 \cdot Ln\ [i(t)/i(0)]\ \text{where}\ i(0)\ \text{is the value of the initial current and}\ Tau1 = L1/(R1+r)$$

If we choose to stop the energy discharge for a current ratio of 1/1000, then the time required is given by the formula $t = 6.91 \cdot Tau1 = 6.91 \cdot L1/(R1+r)$.

If we choose to stop the energy discharge for a current ratio of 1/100, then the time required is given by the formula $t = 4.6 \cdot L1/(R1+r)$.

Figure 16:
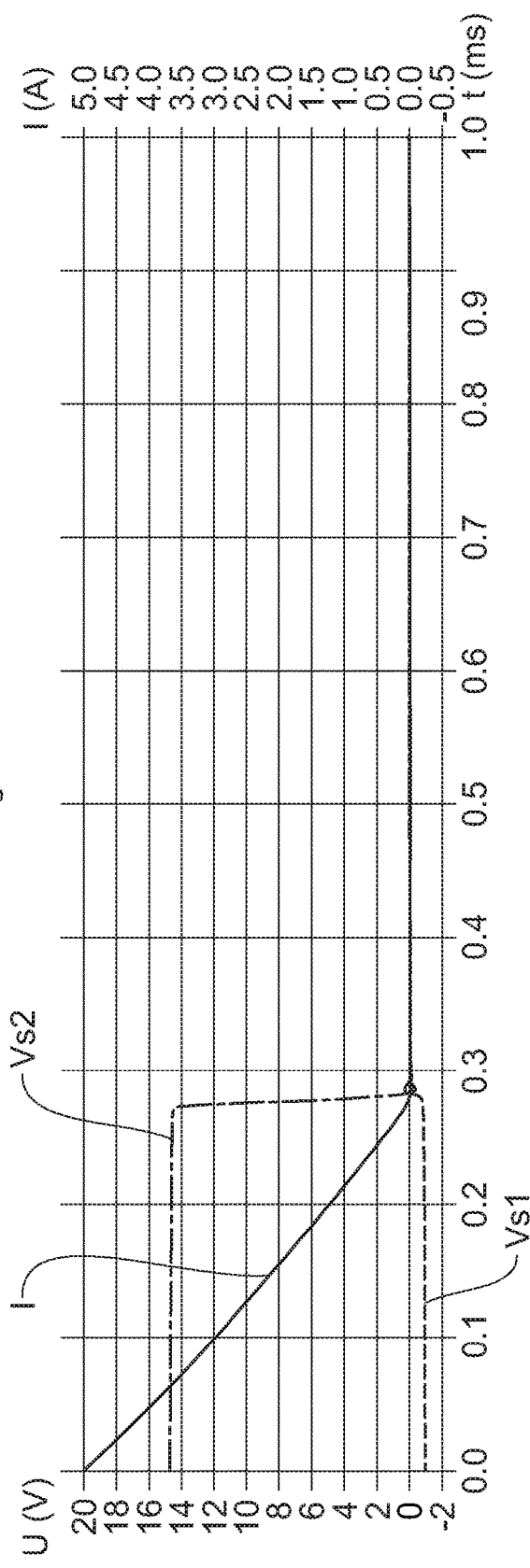

The accuracy for the preservation time for the freewheel depends on the accuracies for the inductance L1, the resistance R1 and the resistance r. For high values of r, the model is too simple because it would be necessary to take into account the capacitors and it is better then to estimate the worst case, that is to say the longest time, by simulation. In FIG. 16, which corresponds to a freewheel resistance of 200 ohms, the simulation gives an ideal time of less than 300 µs for the current discharge through the structural diodes, followed by the neutralization of the oscillations, including less than 0.25 ms or milliseconds of neutralization of the oscillations, while the formula $t = 4.6/201 = 0.022$ ms is for the only neutralization.

The formula is in fact more inaccurate the higher the freewheel resistance. For FIG. 17, with a freewheel resistance of 1 kohm, the time is even more reduced according to the formula, while the simulation shows that it is now not even possible to correctly attenuate the oscillations.

It is possible to combine the first and second optional embodiments of the first embodiment of the method of the present invention.

For example, the detection of the end of discharge can potentially take place on the basis of a discharge voltage of the active output s1, s2 and/or on the basis of the discharge voltage slope after a detection of a discharge current close to zero. In this case, the current threshold can be increased each time the predetermined voltage threshold and/or the predetermined slope threshold are detected. Conversely, the current threshold can be decreased each time the predetermined voltage threshold and/or the predetermined slope threshold are not detected.

Finally, instead of installing detector circuits, it is possible to program only times, vis-à-vis situations where the variation of the current would have been characterized previously. It is thus possible to modify, as required, parameters including a duration of current discharge, flowing through the diodes, before engaging the freewheel and a freewheel time. A favorable optional embodiment is to combine a time constant with the first and second optional modes taken individually or in combination.

It is for example possible to combine the first optional mode of the first embodiment with the determination of a time constant estimating the duration of the discharge. In this case, the detection of the end of discharge can potentially take place on the basis of a discharge voltage of the active output and/or on the basis of the discharge voltage slope after the end of a time constant estimating the discharge time.

The time constant can be increased each time the predetermined voltage threshold and/or the predetermined slope threshold are detected and the time constant can be decreased each time the predetermined voltage threshold and/or the predetermined slope threshold are not detected.

It is possible to combine the first and second optional modes of the first embodiment with the determination of a time constant estimating the duration of the discharge. In this case, the detection of the end of discharge can potentially take place on the basis of a discharge voltage of the active output and/or on the basis of the discharge voltage slope after the end of a time constant estimating the discharge time after a current threshold is crossed, as provided for by the second optional mode.

As in the first case of using a time constant, the time constant can be increased each time the predetermined voltage threshold and/or the predetermined slope threshold are detected. Conversely, the time constant can be decreased each time the predetermined voltage threshold and/or the predetermined slope threshold are not detected.

The second embodiment of the present invention incorporates the features of the implementation of a resistive freewheel in an H-bridge as the aforementioned switching structure.

In this second embodiment of the present invention, illustrated in FIGS. 13 to 17 while referring to FIG. 11 or to FIG. 12, the freewheel is performed in the high or low circuit comprising a nonzero resistance of between 5 and 200 ohms.

The resistive freewheel is triggered before or instead of the end of the current discharge through the structural diodes in the high or low circuit comprising a nonzero resistance of between 5 and 200 ohms.

Figure 11A:
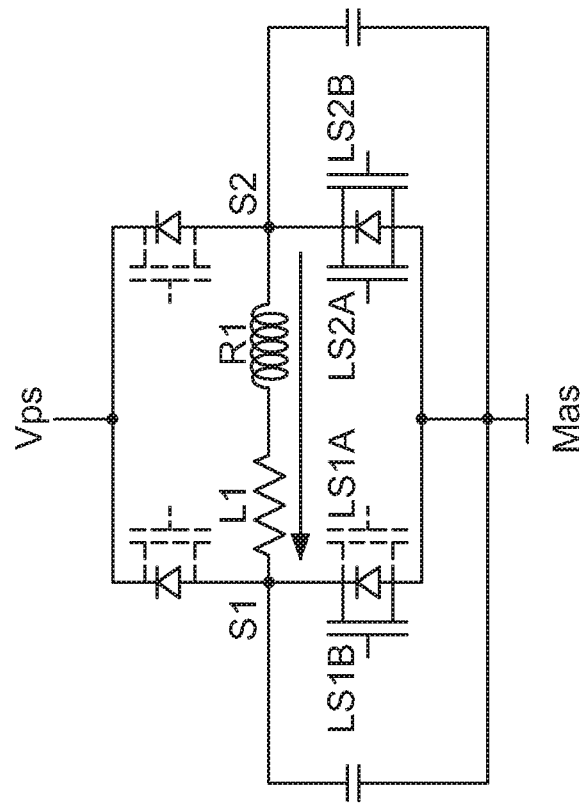
FIGS. 11*a* and 11*b* show, for a low resistive freewheel, the elements used on the basis of the direction of the current, the elements that are not on being in dotted lines.
Figure 11B:
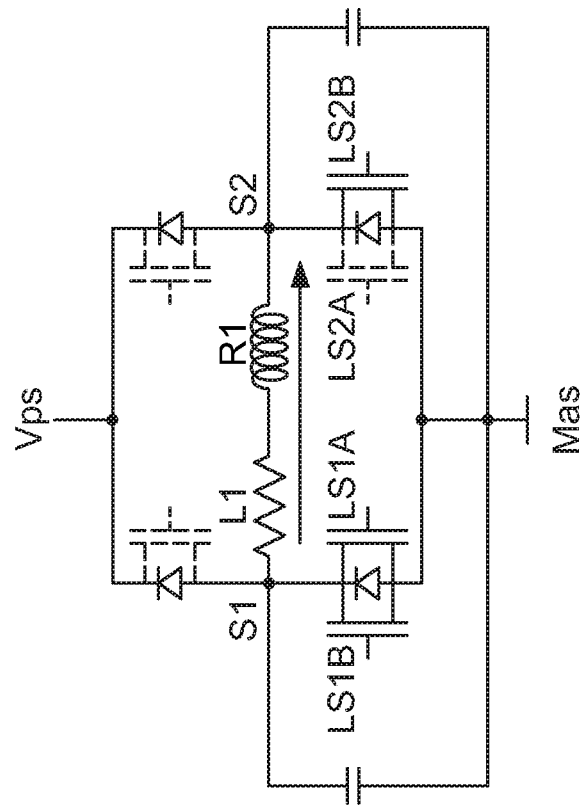
Figure 13:
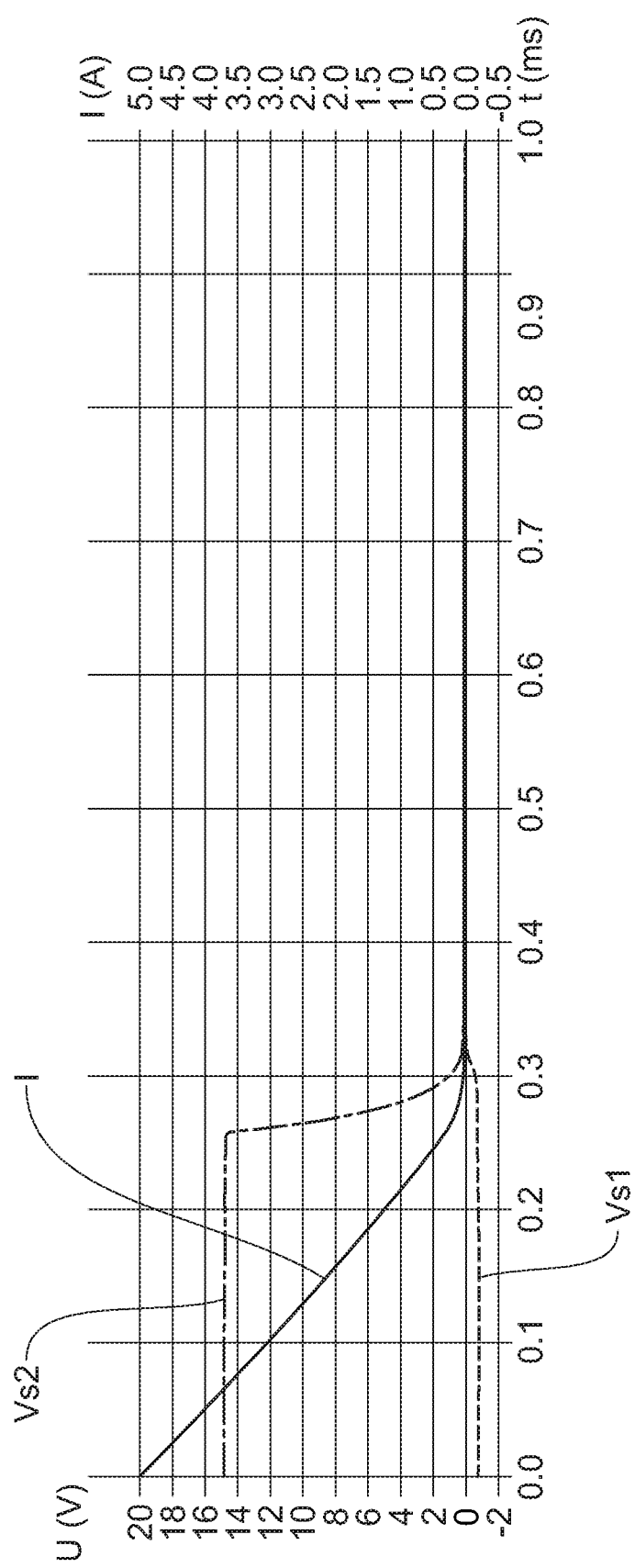

One of the two high HS1 or HS2 or low LS1 or LS2 power switches is then kept only partially on. The other switch is kept fully on. Thus, for a low freewheel, FIGS. 11*a* and 11*b* show switches LS1A and LS1B connected in parallel and controlled separately and switches LS2A and LS2B connected in parallel and controlled separately. As the switches LS1B or LS2B are more resistive than the switches LS1A or LS2A, it is then possible to use a resistive freewheel. FIGS. 12*a* and 12*b* show the same possibility using a high freewheel.

Figure 2:
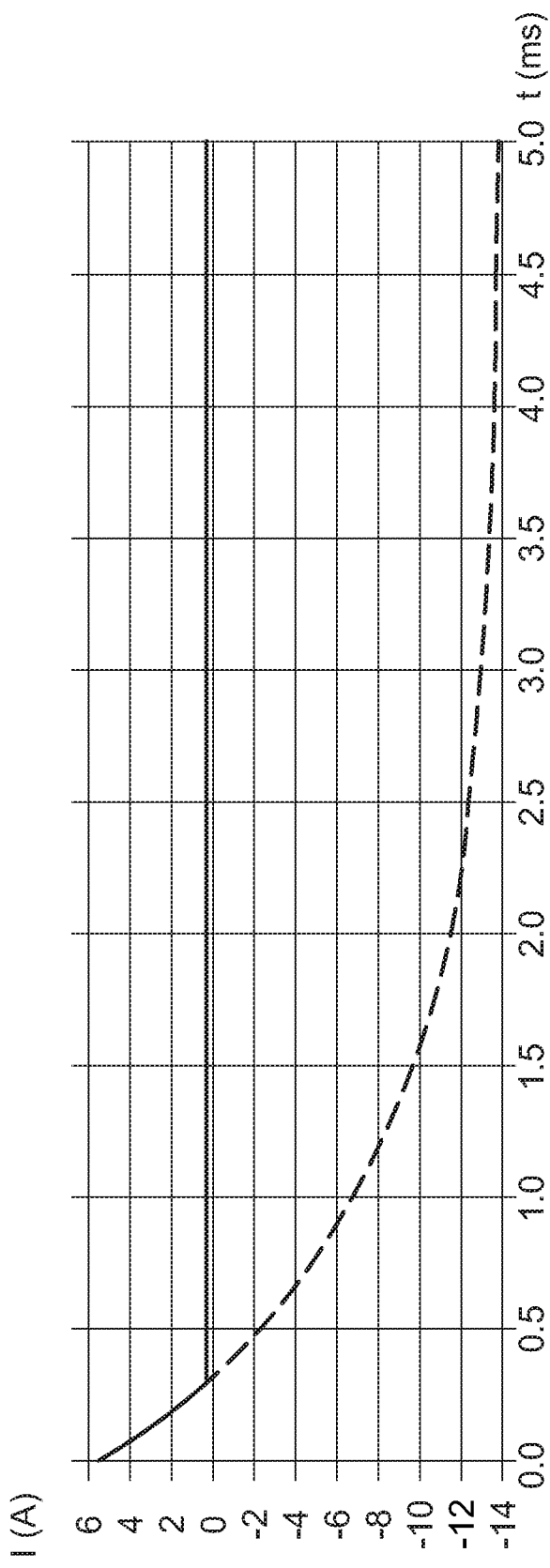
FIG. 2 shows a curve of current decrease as a function of time for a recirculation of the current through the diodes, a recirculation obtained by simulation with the values of 1 mH for the inductance, 1 ohm for the resistance, 14 V for battery voltage and 5 A for the initial current through the inductance.
Figure 3:
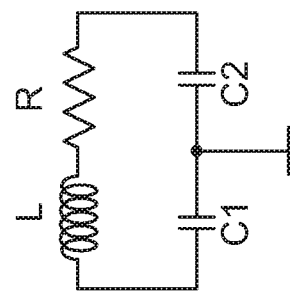
FIG. 3 shows a circuit that is representative of an H-bridge when the low or high power switches of the H-bridge are opened.

This second embodiment can prove to be the most advantageous as a resistive freewheel. Indeed, a simulation can show that the rapid discharge through the diodes for an inductance of 1 mH, a series resistance of 1Ω, a voltage of 14 V, from 5 A, is such that the current drops to 50 mA after 0.3 ms as shown in FIG. 2, but preserving a freewheel then requires an additional 4.6 ms. In the simulation with the result shown in FIG. 13, which is performed for an inductance L equal to 1 mH and a resistance of the load equal to 1Ω, the freewheel resistance of 50Ω, the current I drops quickly and produces a final rounding instead of an angle. There is no visible oscillation on the output voltages Vs1 and Vs2 and the discharge time is comparable to that of recirculation through the diodes without having to use an additional freewheel time.

The curves of FIGS. 13 to 17 are obtained by simulation, with 1 mH for the inductance, 1 ohm for the load resistance, 14 V for the battery voltage, 5 A of initial current through the load. For FIG. 13, the resistance of the freewheel is 50 ohms. For FIG. 14, the resistance of the freewheel is 10 ohms. For FIG. 15, the resistance of the freewheel is 5 ohms. For FIG. 16, the resistance of the freewheel is 200 ohms. For FIG. 17, the resistance of the freewheel is 1 kohm.

This device involves splitting at least one of the two freewheel power switches into two sets: for this split switch, most of the power switch, for example 99.5%, is no longer controlled during the resistive freewheel, but only for activation, and a subset of the so-called split power switch, for example 0.5%, is used both for activation and for the resistive freewheel, these values not being limiting.

This makes it possible to have a low resistive value during the activation phase, during which the current increases, because one power switch brings the voltage from the power source, advantageously the battery, and the other power switch brings the ground potential. The resistive value can be 0.2 ohm, for example, while a relatively high resistive value, for example 50 ohms, is obtained for one of the freewheel power switches during the resistive freewheel.

It can be restrictive to allow the current to flow through the structural diodes. Indeed, in an integrated circuit, the flow of this current causes substrate currents, which are known to induce unforeseen parasitic phenomena. It is therefore necessary either to combat these substrate currents or to avoid, as far as possible, passing current through the structural diodes, or both at the same time.

In this context, the freewheel switch passed through by a current in a direction such that it could flow through the diode is advantageously turned fully on. Otherwise, if for example the intention is to pass 100 mA through 25 ohms, this makes a potential difference of 2.5 V, which is much higher than the threshold of the diode, and therefore this current flows mainly through the structural diode.

On the contrary, if the resistance of the switch is no more than 0.2 ohm, there is only 20 mV of potential difference and there is practically no more current flowing through the structural diode. This is why the freewheel resistor is advantageously produced by only one of the two freewheel transistors, but the two transistors must be able to become resistive on the basis of the direction of the current, which should therefore be known in the control strategy.

Thus, the two power switches of the same low or high pair can be split so as to be partially on. A percentage of one of the two power switches is operational during the resistive freewheel, while the rest of this power switch is inactive. The operational percentage can be between 0.1% and 4% of the totality of each of the low or high pairs of power switches.

In addition to the simulation, the energy approach makes it possible to understand the phenomenon of an improvement by a freewheel resistance that is not low. Indeed, the inductance needs to discharge the same energy $LI^2/2$ in all cases. The inductance impresses the current and the dissipated power is in the form $r.I^2$. Thus, a higher value of the freewheel resistance r results in the energy being dissipated faster owing to a higher power.

FIGS. 14 to 17 show curves of output s1 and s2 voltages for different resistances. For example, if the resistance is reduced to 10 ohms, a time of 500 μs is obtained, as shown in FIG. 14. If the resistance is reduced to 5 ohms, a time of 800 μs is obtained, as shown in FIG. 15.

Figure 17:
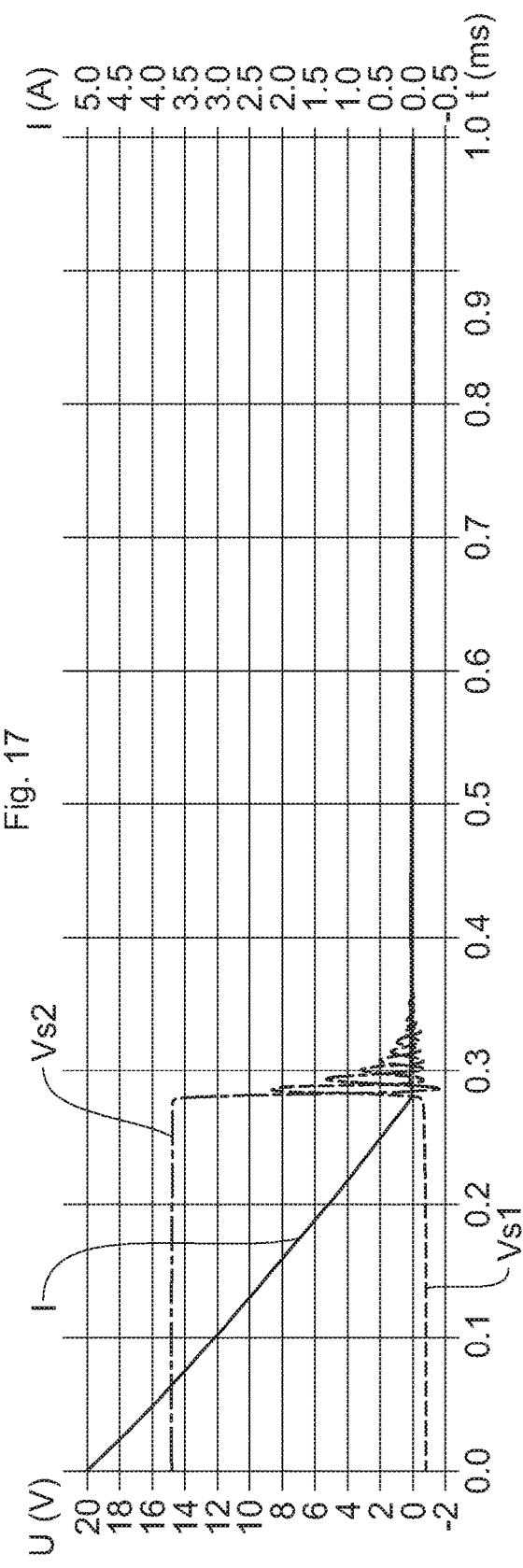

On the contrary, by increasing the resistance to 200 ohms, a time slightly less than 300 μs is obtained, and we begin to see an initiation of oscillation, as shown in FIG. 16. In FIG. 17, with a resistance equal to 1 kohm, the value becomes too strong and the oscillations that were intended to be avoided appear.

In order to adapt to the various application cases, the value of the resistance can be made programmable. This merely requires a larger or smaller portion of the original freewheel power switch to be reserved. If 10 times 0.05% of the initial surface is taken, 10 transistors are produced that have an on-state resistance 2000 times higher than the power switch using the full silicon surface, as is the case during activation. By combining these 10 power switches or transistors, we can reach values ranging from 200 times the activation value to 2000 times the activation value.

For example, if the activation value is 0.2 ohm, then 0.05% of the surface gives an elementary resistance of 400 ohms. Thus, a single selected power switch gives a resistance of 400 ohms, two selected power switches give a resistance of 200 ohms, three selected power switches give a resistance of 133 ohms, four selected power switches give a resistance of 100 ohms, five selected power switches give a resistance of 80 ohms, six selected power switches give a resistance of 67 ohms, seven selected power switches give a resistance of 57 ohms, eight selected power switches give a resistance of 50 ohms and ten selected power switches give a resistance of 40 ohms.

In this example, there are more and more close values when the minimum is approached. It is not necessarily useful to offer all the values. For example, a choice of three bits involves eliminating two possibilities that are resistances of 50 ohms and 67 ohms, respectively.

The disadvantage of this second embodiment, compared to the first, is greater heating in the resistive transistor. The advantages of this second embodiment, compared to the first, are that it does not require a detector for the end of rapid discharge through the structural diodes, a discharge time possibly being shorter than the rapid discharge through the diodes, and the absence of substrate currents. However, the limitation relating to the heating in the switch can lead to the two embodiments being combined, starting with the discharge through the structural diodes for a time that is limited but sufficient to reduce the current. If the current is reduced by half, for example, the heating is reduced by a factor of 4. This combination eliminates the advantage over the substrate current.

Referring to all the figures, the present invention relates to an assembly comprising an inductive load 1, L1, R1 and its power supply device, for the implementation of the first and second embodiments of the method according to the invention, respectively.

For the features common to the two assemblies, the supply device comprises a switching structure of an H-bridge forming high and low circuits, respectively, the switching structure comprising a pair of high HS1, HS2 or low LS1, LS2 power switches controlled by a control unit between an output s1, s2 and an electric power source Vps or a ground Mas, respectively, for controlling the inductive load 1, L1, R1.

At least two capacitors C1, C2 are connected to bypass the inductive load 1, L1, R1 between the outputs s1, s2. The control unit controls a high or low freewheel by selective action on the pair of high HS1, HS2 or low LS1, LS2 power switches.

For the implementation of the method according to the first embodiment of the present invention, the control unit comprises means for at least one detection of an end of current discharge through the structural diodes either vis-à-vis a voltage, or a voltage slope, or a current or a time constant, these parameters being able to be combined.

The control unit comprises means for storing a trigger threshold specific to the detection or to each detection, means for comparing the trigger threshold with the detected parameter and means for forced preservation of the freewheel when the trigger threshold is crossed for a stored predetermined preservation time.

For the implementation of the method according to the second embodiment of the present invention, the control unit comprises splitting means on a pair of high HS1, HS2 or low LS1, LS2 power switches in order to keep only one of the two power switches of the high HS1, HS2 or low LS1, LS2 pair partially on, being called a split switch, and the other fully on during the resistive freewheel while the rest of the partially-on or split power switch of the high HS1, HS2 or low LS1, LS2 pair is inactive. These splitting means can be adjustable by preserving a variable portion of one of the two power switches, which is the split switch.

The invention claimed is:

1. A method for at least partially removing oscillations occurring at an end of a current discharge through structural diodes for a switching structure supplying power to an inductive load (1, L1, R1) in the form of an H-bridge forming a high and low circuit,
   the switching structure having two controlled high (HS1, HS2) or low (LS1, LS2) power switches forming part of a high circuit or a low circuit, respectively, between a respective output (s1, s2) and a power source (Vps) or a ground (mas),
   the switching structure being adapted to control a current in the load by being connected to the electric power source (Vps) or to the ground (mas) in order to control the inductive load (1, L1, R1),
   at least two capacitors (C1, C2) being connected to bypass the inductive load (1, L1, R1) between the outputs (s1, s2), the switching structure having a first one of the outputs (s1, s2) below the ground (mas) potential and a second of the outputs (s1, s2) above the potential of the power source (Vps) during the current discharge through the structural diodes, with no high (HS1, HS2) or low (LS1, LS2) power switch then being on, a discharge current leaving one output of the first and second outputs (s1, s2) for the other of the first and second outputs (s2, s1),
   voltage oscillations occurring on the outputs (s1, s2) at the end of current discharge through the structural diodes, said method comprising:
   a detection of the end of discharge; and
   a forced preservation of a freewheel after the detection of the end of discharge,
   the forced preservation of the freewheel after the detection of the end of discharge taking place for a predetermined preservation time.

2. The method as claimed in claim 1, wherein the detection of the end of discharge takes place either on the basis of a discharge voltage of an output of said outputs (s1, s2) that corresponds to the cancelation of the discharge current through the diodes or on the basis of the discharge voltage slope or else on the basis of both the discharge voltage and the discharge voltage slope,
   the predetermined preservation time for the freewheel starting as soon as the discharge voltage goes back above a predetermined calibratable voltage threshold and/or as soon as the voltage slope is higher than a predetermined calibratable slope threshold,
   the voltage and voltage slope thresholds being predetermined so as to be representative of first oscillations occurring and the predetermined calibratable preservation time for the freewheel, said preservation time being a time calculated or estimated by experience so that the oscillations are at least attenuated by being below an oscillation threshold of less than 5%.

3. The method as claimed in claim 2, wherein the freewheel time is programmed and determined either by calculation or by experience, if applicable after detection of a nonzero current threshold.

4. An assembly, comprising:
   an inductive load (1, L1, R1); and
   a power supply device,
   the supply device comprising a switching structure of an H-bridge forming high and low circuits, respectively, the switching structure comprising a pair of high (HS1, HS2) or low (LS1, LS2) power switches controlled by a control unit between an output (s1, s2) and an electric power source (Vps) or a ground (mas), respectively, for controlling the inductive load (1, L1, R1),
   at least two capacitors (C1, C2) being connected to bypass the inductive load (1, L1, R1) between the outputs (s1, s2),
   the control unit controlling a freewheel by selective action on the pair of high (HS1, HS2) or low (LS1, LS2) power switches, wherein the assembly implements a method for at least partially removing the oscillations occurring at the end of a current discharge through the structural diodes as claimed in claim 3,
   the control unit comprises means for at least one detection of an end of current discharge through the structural diodes, means for storing a trigger threshold specific to the detection or to each detection, and means for forced preservation of the freewheel when the trigger threshold is crossed for a stored predetermined preservation time.

5. The method as claimed in claim 1, wherein the detection of the end of discharge takes place on the basis of a detection of a discharge current close to zero and/or a detection of the current slope, the predetermined preservation time for the freewheel starting from said detection of current and/or of current slope and the predetermined preservation time for the freewheel being a time calculated or estimated by experience so that the oscillations are at least attenuated by being below an oscillation threshold of less than 5%.

6. The method as claimed in claim 5, wherein the detection of the end of discharge takes place on the basis of a detection of a discharge current that has not yet reached zero, and consideration is given to a double current threshold and a time interval to move from one threshold to the other, with calculation, on the basis of the two thresholds and the time interval, of a future instant with a margin of uncertainty, at which future instant the current becomes zero, and of a time for which the freewheel lasts.

7. The method as claimed in claim 6, wherein the freewheel time is programmed and determined either by calculation or by experience, if applicable after detection of a nonzero current threshold.

8. An assembly, comprising:
an inductive load (1, L1, R1); and
a power supply device,
the supply device comprising a switching structure of an H-bridge forming high and low circuits, respectively, the switching structure comprising a pair of high (HS1, HS2) or low (LS1, LS2) power switches controlled by a control unit between an output (s1, s2) and an electric power source (Vps) or a ground (mas), respectively, for controlling the inductive load (1, L1, R1),
at least two capacitors (C1, C2) being connected to bypass the inductive load (1, L1, R1) between the outputs (s1, s2),
the control unit controlling a freewheel by selective action on the pair of high (HS1, HS2) or low (LS1, LS2) power switches, wherein the assembly implements a method for at least partially removing the oscillations occurring at the end of a current discharge through the structural diodes as claimed in claim 7,
the control unit comprises means for at least one detection of an end of current discharge through the structural diodes, means for storing a trigger threshold specific to the detection or to each detection, and means for forced preservation of the freewheel when the trigger threshold is crossed for a stored predetermined preservation time.

9. The method as claimed in claim 5, wherein the freewheel time is programmed and determined either by calculation or by experience, if applicable after detection of a nonzero current threshold.

10. An assembly, comprising:
an inductive load (1, L1, R1); and
a power supply device,
the supply device comprising a switching structure of an H-bridge forming high and low circuits, respectively, the switching structure comprising a pair of high (HS1, HS2) or low (LS1, LS2) power switches controlled by a control unit between an output (s1, s2) and an electric power source (Vps) or a ground (mas), respectively, for controlling the inductive load (1, L1, R1),
at least two capacitors (C1, C2) being connected to bypass the inductive load (1, L1, R1) between the outputs (s1, s2),
the control unit controlling a freewheel by selective action on the pair of high (HS1, HS2) or low (LS1, LS2) power switches, wherein the assembly implements a method for at least partially removing the oscillations occurring at the end of a current discharge through the structural diodes as claimed in claim 9,
the control unit comprises means for at least one detection of an end of current discharge through the structural diodes, means for storing a trigger threshold specific to the detection or to each detection, and means for forced preservation of the freewheel when the trigger threshold is crossed for a stored predetermined preservation time.

11. An assembly, comprising:
an inductive load (1, L1, R1); and
a power supply device,
the supply device comprising a switching structure of an H-bridge forming high and low circuits, respectively, the switching structure comprising a pair of high (HS1, HS2) or low (LS1, LS2) power switches controlled by a control unit between an output (s1, s2) and an electric power source (Vps) or a ground (mas), respectively, for controlling the inductive load (1, L1, R1),
at least two capacitors (C1, C2) being connected to bypass the inductive load (1, L1, R1) between the outputs (s1, s2),
the control unit controlling a freewheel by selective action on the pair of high (HS1, HS2) or low (LS1, LS2) power switches, wherein the assembly implements a method for at least partially removing the oscillations occurring at the end of a current discharge through the structural diodes as claimed in claim 5,
the control unit comprises means for at least one detection of an end of current discharge through the structural diodes, means for storing a trigger threshold specific to the detection or to each detection, and means for forced preservation of the freewheel when the trigger threshold is crossed for a stored predetermined preservation time.

12. The method as claimed in claim 1, wherein the detection of the end of discharge potentially takes place on the basis of a discharge voltage of an active output of said outputs (s1, s2) and/or on the basis of the discharge voltage slope after a detection of a discharge current close to zero, the current threshold being increased each time the predetermined voltage threshold and/or the predetermined slope threshold are detected and the current threshold being decreased each time the predetermined voltage threshold and/or the predetermined slope threshold are not detected.

13. The method as claimed in claim 12, wherein the freewheel time is programmed and determined either by calculation or by experience, if applicable after detection of a nonzero current threshold.

14. The method as claimed in claim 1, wherein the detection of the end of discharge potentially takes place on the basis of a discharge voltage of an active output of said outputs (s1, s2) and/or on the basis of the discharge voltage slope after an end of a time constant estimating the discharge time, the time constant being increased each time the predetermined voltage threshold and/or the predetermined slope threshold are detected and the time constant being decreased each time the predetermined voltage threshold and/or the predetermined slope threshold are not detected.

15. The method as claimed in claim 14, wherein the time constant estimates the discharge time after a current threshold is crossed.

16. The method as claimed in claim 15, wherein the freewheel time is programmed and determined either by calculation or by experience, if applicable after detection of a nonzero current threshold.

17. The method as claimed in claim 14, wherein the freewheel time is programmed and determined either by calculation or by experience, if applicable after detection of a nonzero current threshold.

18. The method as claimed in claim 1, wherein the freewheel time is programmed and determined either by calculation or by experience, if applicable after detection of a nonzero current threshold.

19. An assembly, comprising:
an inductive load (1, L1, R1); and
a power supply device,
the supply device comprising a switching structure of an H-bridge forming high and low circuits, respectively, the switching structure comprising a pair of high (HS1, HS2) or low (LS1, LS2) power switches controlled by a control unit between an output (s1, s2) and an electric power source (Vps) or a ground (mas), respectively, for controlling the inductive load (1, L1, R1),
at least two capacitors (C1, C2) being connected to bypass the inductive load (1, L1, R1) between the outputs (s1, s2),
the control unit controlling a freewheel by selective action on the pair of high (HS1, HS2) or low (LS1, LS2) power switches, wherein the assembly implements a method for at least partially removing the oscillations occurring at the end of a current discharge through the structural diodes as claimed in claim 18,
the control unit comprises means for at least one detection of an end of current discharge through the structural diodes, means for storing a trigger threshold specific to the detection or to each detection, and means for forced preservation of the freewheel when the trigger threshold is crossed for a stored predetermined preservation time.

20. An assembly, comprising:
an inductive load (1, L1, R1); and
a power supply device,
the supply device comprising a switching structure of an H-bridge forming high and low circuits, respectively, the switching structure comprising a pair of high (HS1, HS2) or low (LS1, LS2) power switches controlled by a control unit between an output (s1, s2) and an electric power source (Vps) or a ground (mas), respectively, for controlling the inductive load (1, L1, R1),
at least two capacitors (C1, C2) being connected to bypass the inductive load (1, L1, R1) between the outputs (s1, s2),
the control unit controlling a freewheel by selective action on the pair of high (HS1, HS2) or low (LS1, LS2) power switches, wherein the assembly is configured to at least partially remove oscillations occurring at the end of a current discharge through the structural diodes by detecting the end of the current discharge, and a forced preservation of the freewheel after the detection of the end of discharge,
the control unit comprising means for at least one detection of the end of the current discharge through the structural diodes, means for storing a trigger threshold specific to the detection or to each detection, and means for forced preservation of the freewheel when the trigger threshold is crossed for a stored predetermined preservation time.

* * * * *